United States Patent
Imamura et al.

(10) Patent No.: US 10,859,649 B2
(45) Date of Patent: Dec. 8, 2020

(54) VIBRATION REDUCTION FOR A MAGNETIC RESONANCE IMAGING APPARATUS

(71) Applicant: Hitachi, Ltd., Tokyo (JP)

(72) Inventors: Yukinobu Imamura, Tokyo (JP); Akira Kurome, Tokyo (JP); Takeshi Yatsuo, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 16/383,825

(22) Filed: Apr. 15, 2019

(65) Prior Publication Data

US 2020/0072922 A1 Mar. 5, 2020

(30) Foreign Application Priority Data

Sep. 4, 2018 (JP) .................. 2018-165497

(51) Int. Cl.
*G01R 33/385* (2006.01)

(52) U.S. Cl.
CPC ..... *G01R 33/3854* (2013.01); *G01R 33/3858* (2013.01)

(58) Field of Classification Search
CPC ............ G01R 33/3854; G01R 33/3858; G01R 33/4215
See application file for complete search history.

(56) References Cited

U.S. PATENT DOCUMENTS

| 2006/0006866 A1* | 1/2006 | Roozen | G01R 33/3854 324/318 |
|---|---|---|---|
| 2011/0199086 A1 | 8/2011 | Tsuda | |
| 2013/0002252 A1* | 1/2013 | Kidane | G01R 33/3854 324/322 |

FOREIGN PATENT DOCUMENTS

JP        5243437 B2    7/2013

* cited by examiner

*Primary Examiner* — G. M. A Hyder
(74) *Attorney, Agent, or Firm* — Foley & Lardner LLP (57) ABSTRACT

According to one embodiment, a magnetic resonance imaging apparatus includes: a cylindrical magnetic pole for generating a static magnetic field in an imaging region; a cylindrical gradient magnetic field coil arranged on a radially inner side of the magnetic pole, coaxially with the magnetic pole to generate a dynamic magnetic field having a linear magnetic field strength in the imaging region; a cylindrical high frequency coil arranged on a radially inner side of the gradient magnetic field coil, coaxially with the magnetic pole and the gradient magnetic field coil to generate a high frequency magnetic field in the imaging region; and a computer system for processing signals to obtain images. The magnetic resonance imaging apparatus further includes at least two loop-shaped additional coils arranged on the radially outer side of the gradient magnetic field coil and having different electric current circulating direction.

8 Claims, 9 Drawing Sheets

VIBRATION REDUCTION FOR A MAGNETIC RESONANCE IMAGING APPARATUS

BACKGROUND OF THE INVENTION

1. Field of the Invention

The present invention relates to a magnetic resonance imaging apparatus. More particularly, the present invention relates to a magnetic resonance imaging apparatus including a gradient magnetic field coil that generates a magnetic field having a gradient in strength at a spatial position in order to give position information to an imaging region.

2. Description of the Related Art

The magnetic resonance imaging apparatus mainly includes a magnet device, a gradient magnetic field coil, a high frequency coil, a receiving coil, and a computer system. The magnet device generates a uniform static magnetic field in the imaging region into which a subject is inserted. The gradient magnetic field coil generates the pulsed magnetic field (hereinafter referred to as "gradient magnetic field") with strength gradient at a spatial position. The high frequency coil irradiates the subject with a high frequency pulse. The receiving coil receives a magnetic resonance signal from the subject. The computer system processes the received signal to create and display an image.

In order to improve the main performance of the magnetic resonance imaging apparatus, there are ways of increasing the strength of the static magnetic field generated by the magnet device and increasing the strength and magnetic field accuracy of the gradient magnetic field by the gradient magnetic field coil. The static magnetic field is used to align the direction of nuclear spin of an imaging target. The stronger the strength of the static magnetic field becomes, the more nuclear spin directions are aligned, allowing a clear image to be obtained. Therefore, the magnetic resonance imaging apparatus tends to use magnets that generate stronger static magnetic field strength.

Since the gradient magnetic field coil is used for giving position information to the magnetic resonance signal generated in the imaging region, a higher strength of the gradient magnetic field or a higher proximity to a linear gradient distribution as linear information as magnetic accuracy can result in more accurate position information. As a result, acquisition of a high-definition image or capturing in a short time can be achieved. For this reason, it is necessary for the gradient magnetic field coil to have a configuration of energizing with a larger electric current or a configuration with a winding of a large number of coil conductors. For the electric current flowing through the gradient magnetic field coil, a pulse energization of a faster large electric current is required. It is necessary for the high frequency coil to generate a magnetic resonance phenomenon in the nuclear spin and to irradiate an object to be imaged with the electromagnetic field of a frequency determined from the magnetic resonance field strength as an electromagnetic wave with a uniform distribution.

In a general horizontal magnetic field type magnetic resonance imaging apparatus, the gradient magnetic field coil is installed in a substantially concentric cylindrical shape on an inner peripheral side of a static magnetic field magnet as a substantially cylindrical magnet device. The high frequency coil is in a substantially concentric cylindrical shape, and is disposed on the inner peripheral side of the gradient magnetic field coil on a substantially concentric cylindrical axis with the static magnetic field magnet and the gradient magnetic field coil.

When a large pulse electric current is flowed through the gradient magnetic field coil, a Lorentz force is generated between the gradient magnetic field and the static magnetic field by the electric current flowing through the conductors of the gradient magnetic field coil, thereby generating a vibrating electromagnetic force. Meanwhile, in the static magnetic field magnet, a cortical force of the electromagnetic force of the gradient magnetic field coil is generated. In many cases, the gradient magnetic field coil also serves as a structure for supporting a bed on which the high frequency coil or a subject is placed. Therefore, the vibration of the gradient magnetic field coil indirectly causes the subject on the bed to vibrate. Particularly, when there is large low frequency vibration having a frequency of 100 Hz or less, it may be unpleasant for some patients who are the subjects. When the subject greatly vibrates, the acquired image may be blurred and the image quality may be deteriorated in some cases.

On the other hand, the reaction force of the electromagnetic force generated in the static magnetic field magnet may cause a superconducting coil or a magnetic body forming the static magnetic field magnet to vibrate, thus causing irregularity in the static magnetic field strength in the imaging region in some cases, which may cause degradation from the original image quality. In recent years, particularly, there is an increasing demand for reducing the vibration of the gradient magnetic field coil, because the vibration electromagnetic force generated in the gradient magnetic field coil increases as the gradient magnetic field strength or the static magnetic field strength increases.

In the related art, a magnetic resonance imaging apparatus equipped with a technology for suppressing vibration described in Japanese Patent No. 5243437 (PTL 1) is known. In the magnetic resonance imaging apparatus of the related art, the gradient magnetic field coil is fixed to the static magnetic field magnet at a plurality of positions in order to suppress the deformation generated in the gradient magnetic field coil structure due to the Lorentz force acting on the coil conductor when the gradient magnetic field coil is energized. Specifically, in the magnetic resonance imaging apparatus, the gradient magnetic field coil is fixed to the static magnetic field magnet at a point or on a straight line where the deformation of the gradient magnetic field coil is maximum. With this configuration, it is possible to suppress the deformation of irregularities generated in the gradient magnetic field coil.

Problem to be Solved by Invention

However, in the magnetic resonance imaging apparatus disclosed in PTL 1, since it is necessary to securely fix the gradient magnetic field coil to the static magnetic field magnet, a vibration of the gradient magnetic field coil may propagate and cause the entire magnetic resonance imaging apparatus including the static magnetic field magnet to vibrate. In this case, in order to prevent the vibration from being transmitted to the subject, it is necessary to support the bed from the floor surface to keep the vibration from being transmitted not only from the gradient magnetic field coil, but also from the static magnetic field magnet, which makes the construction complicated. In addition, since the electromagnetic force generated in the gradient magnetic field coil is not reduced, the electromagnetic force generated in the static magnetic field magnet as the reaction force may cause the static magnetic field magnet to vibrate, and there also is a concern about the image quality being influenced based on the vibration of the static magnetic field.

SUMMARY OF THE INVENTION

The present invention has been made in consideration of the circumstances described above, and an object thereof is to provide a magnetic resonance imaging apparatus capable of suitably reducing the vibration electromagnetic force of the gradient magnetic field coil which is a cause of the vibration of the subject.

A magnetic resonance imaging apparatus according to the present invention includes a cylindrical magnetic pole for generating a static magnetic field in an imaging region, a cylindrical gradient magnetic field coil arranged on a radially inner side of the magnetic pole, coaxially with the magnetic pole to generate a dynamic magnetic field having a linear magnetic field strength in the imaging region, a cylindrical high frequency coil arranged on a radially inner side of the gradient magnetic field coil, coaxially with the magnetic pole and the gradient magnetic field coil to generate a high frequency magnetic field in the imaging region, and a computer system for processing signals to obtain images. The magnetic resonance imaging apparatus further includes at least two loop-shaped additional coils arranged on a radially outer side of the gradient magnetic field coil and having different electric current circulating direction.

According to the present invention, it is possible to obtain a magnetic resonance imaging apparatus capable of suitably reducing a vibration electromagnetic force of a gradient magnetic field coil which is a cause of a vibration of a subject.

BRIEF DESCRIPTION OF DRAWINGS

FIGS. 2A and 2B are diagrams illustrating a conductor structure of a gradient magnetic field coil of the magnetic resonance imaging apparatus according to the first embodiment of the present invention, in which

FIGS. 4A and 4B are diagrams illustrating a conductor structure of a gradient magnetic field coil of the magnetic resonance imaging apparatus according to the first embodiment of the present invention, in which

DESCRIPTION OF THE PREFERRED EMBODIMENTS

Hereinafter, embodiments of a magnetic resonance imaging apparatus according to the present invention will be described with reference to the drawings. In each of the embodiments, the same elements are denoted by the same reference numerals, and duplicate descriptions are not repeated.

First Embodiment

Figure 1:
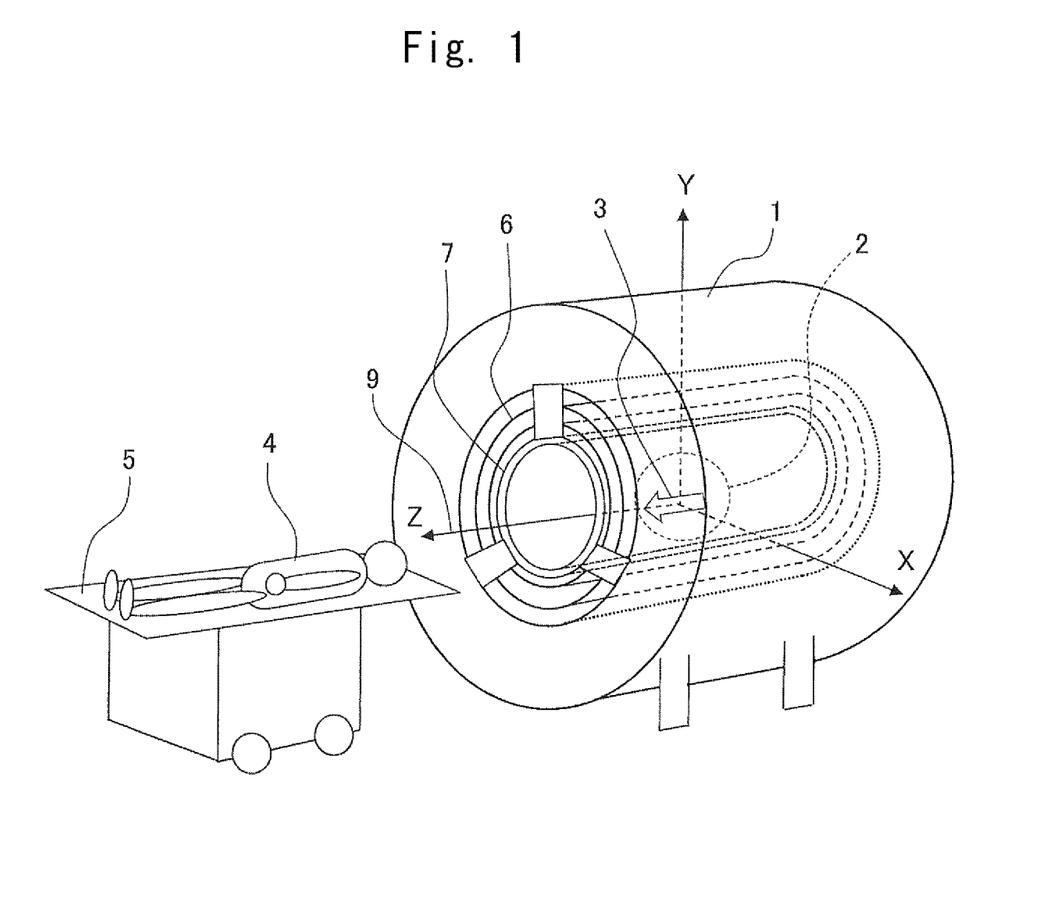
FIG. 1 is a perspective view illustrating a schematic structure of a magnetic resonance imaging apparatus according to a first embodiment of the present invention.

First, an overall configuration of a magnetic resonance imaging apparatus will be described with reference to FIG. 1. The magnetic resonance imaging apparatus (hereinafter referred to as "MRI apparatus") includes a cylindrical magnetic pole 1 whose central axis is a Z axis 9 (CL, center line), in which the magnetic pole 1 generates a static magnetic field in an imaging region 2 in the same direction as the Z axis 9 indicated by a void arrow 3 in FIG. 1. A subject 4 is carried to the imaging region 2 by a movable bed 5. The MRI apparatus processes a signal by a computer system (not illustrated) to obtain an image.

The MRI apparatus includes a cylindrical gradient magnetic field coil 6 disposed on a radially inner side of the magnetic pole 1 coaxially with the magnetic pole 1, and a cylindrical high frequency coil 7 arranged on a radially inner side of the gradient magnetic field coil 6 coaxially with the magnetic pole 1. The gradient magnetic field coil 6 generates a dynamic magnetic field having a linear magnetic field strength in the imaging region 2. A high frequency coil 7 generates a high frequency magnetic field in the imaging region 2. The gradient magnetic field coil 6 and the high frequency coil 7 are normal conduction coils that obtain the position information of image acquisition and magnetic resonance to obtain a signal. These coils are, integrally with the magnetic pole 1, covered with a cover (not illustrated).

As a main component other than those described above, the MRI apparatus includes a power supply (not illustrated) for supplying electric current to the gradient magnetic field coil 6 and the high frequency coil 7.

Figure 2A:
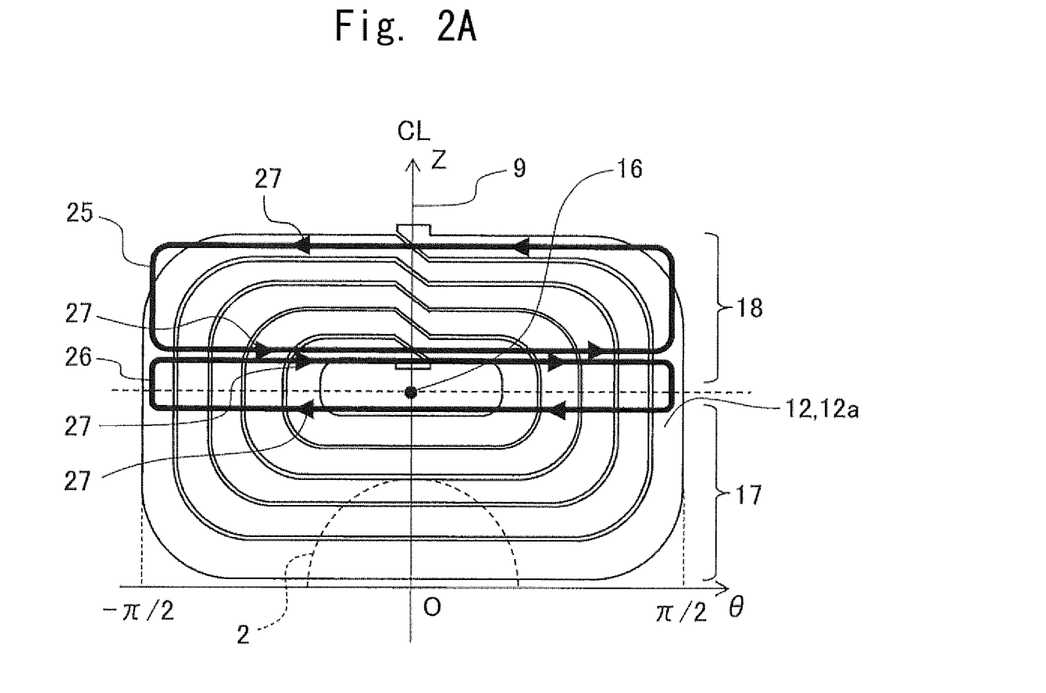
FIG. 2A is a partially developed view illustrating a main coil and an additional coil.
Figure 2B:
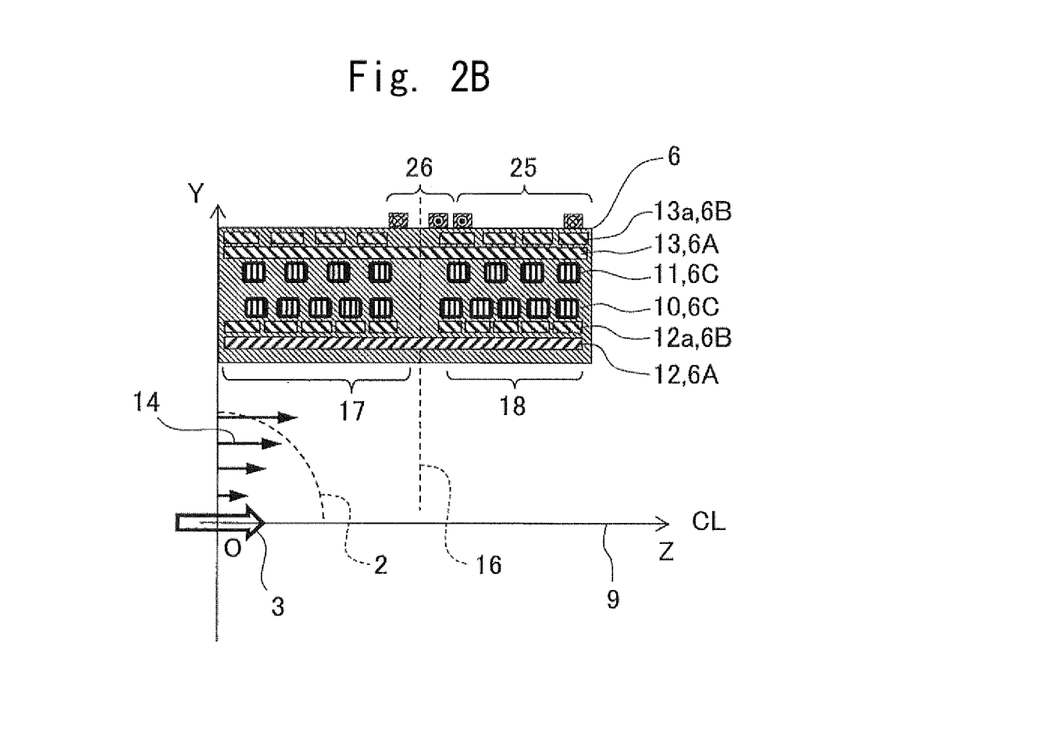
FIG. 2B is a partial cross-sectional view.
Figure 4A:
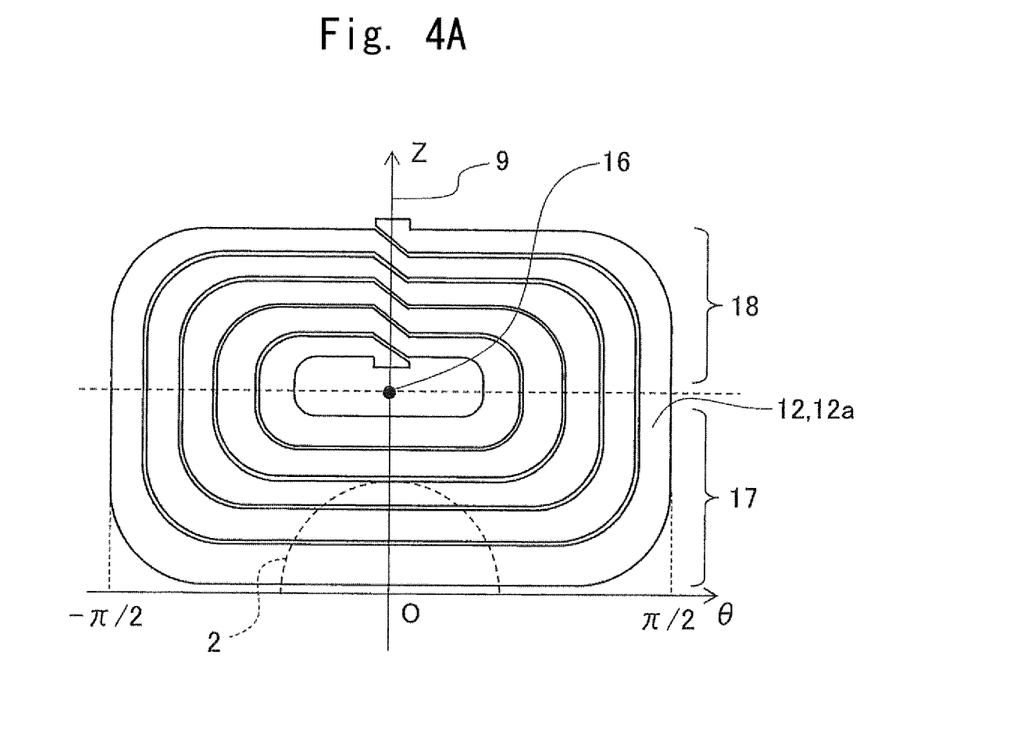
FIG. 4A is a partially developed view illustrating a main coil.
Figure 4B:
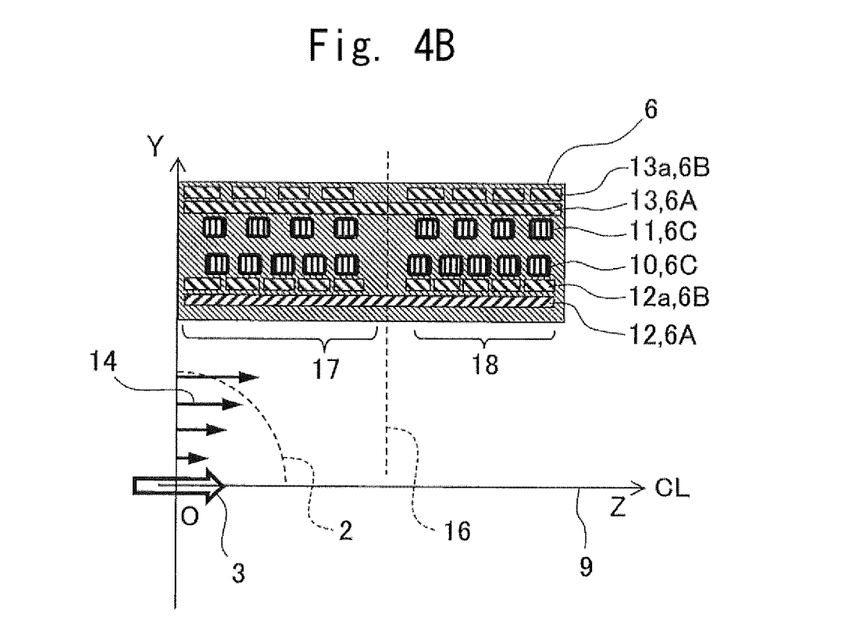
FIG. 4B is a partial cross-sectional view.

As illustrated in FIGS. 2B and 4B, a gradient magnetic field 14 is generated in the imaging region 2. The gradient magnetic field 14 is a magnetic field having a gradient distribution such that the component in the direction of the static magnetic field indicated by the void arrow 3 in FIGS. 2B and 4B is proportional in strength to the distance from the center O.

The gradient magnetic field coil 6 includes three sets of coils including an X direction gradient magnetic field coil 6A, a Y direction gradient magnetic field coil 6B, and a Z direction gradient magnetic field coil 6C in order to generate an arbitrary gradient magnetic field in three directions of XYZ orthogonal to each other with the direction of the static magnetic field as the Z direction. The gradient magnetic field coil 6 has a cylindrical shape around the Z axis 9 with the Z axis 9 as a central axis and is rotationally symmetric about the Y axis. In each of the coils 6A to 6C, a pulsed electric current is independently supplied according to the direction of the gradient magnetic field. With energization, Joule heat is generated in each of the coils 6A to 6C. For this reason, the gradient magnetic field coil 6 may be connected to a pipe or the like through which cooling water is circulated by an external pumping device (not illustrated). With such a configuration, it is possible to reduce the temperature rise of the gradient magnetic field coil 6.

In the MRI apparatus according to the present embodiment, a superconducting coil having a static magnetic field strength of 1 Tesla or more is used for the magnetic pole 1, and an active shield type in which the gradient magnetic field coil 6 is formed of a main coil and a shield coil is adopted.

The X direction gradient magnetic field coil 6A includes the main coil 12 and the shield coil 13, and the Y direction gradient magnetic field coil 6B includes the main coil 12a and the shield coil 13a. The Z direction gradient magnetic field coil 6C includes a main coil 10 and a shield coil 11.

A main coil 12 and a shield coil 13 for the X direction gradient magnetic field coil 6A have substantially semicircular shape when viewed from the Z-axis 9 direction and are symmetrically arranged in the X-axis direction with a plane including the Y-axis and the Z-axis as a boundary. A main coil 12a and a shield coil 13a for the Y direction gradient magnetic field coil 6B have the substantially semicircular shape when viewed from the Z-axis 9 direction and are symmetrically arranged in the Y-axis direction with a plane including the X-axis and the Z-axis as a boundary.

The main coil 10 and the shield coil 11 for the Z direction gradient magnetic field coil 6C have substantially solenoidal shape wound around the Z axis 9 as a central axis in the circulating direction.

As illustrated in FIG. 4B, the gradient magnetic field coil 6 is formed by stacking the main coils 12, 12a, and 10 in order from an inner peripheral side to an outer peripheral side, and further successively stacking the shield coils 11, 13, and 13a in order and then integrally curing the coil with an epoxy resin or the like.

Figure 3:
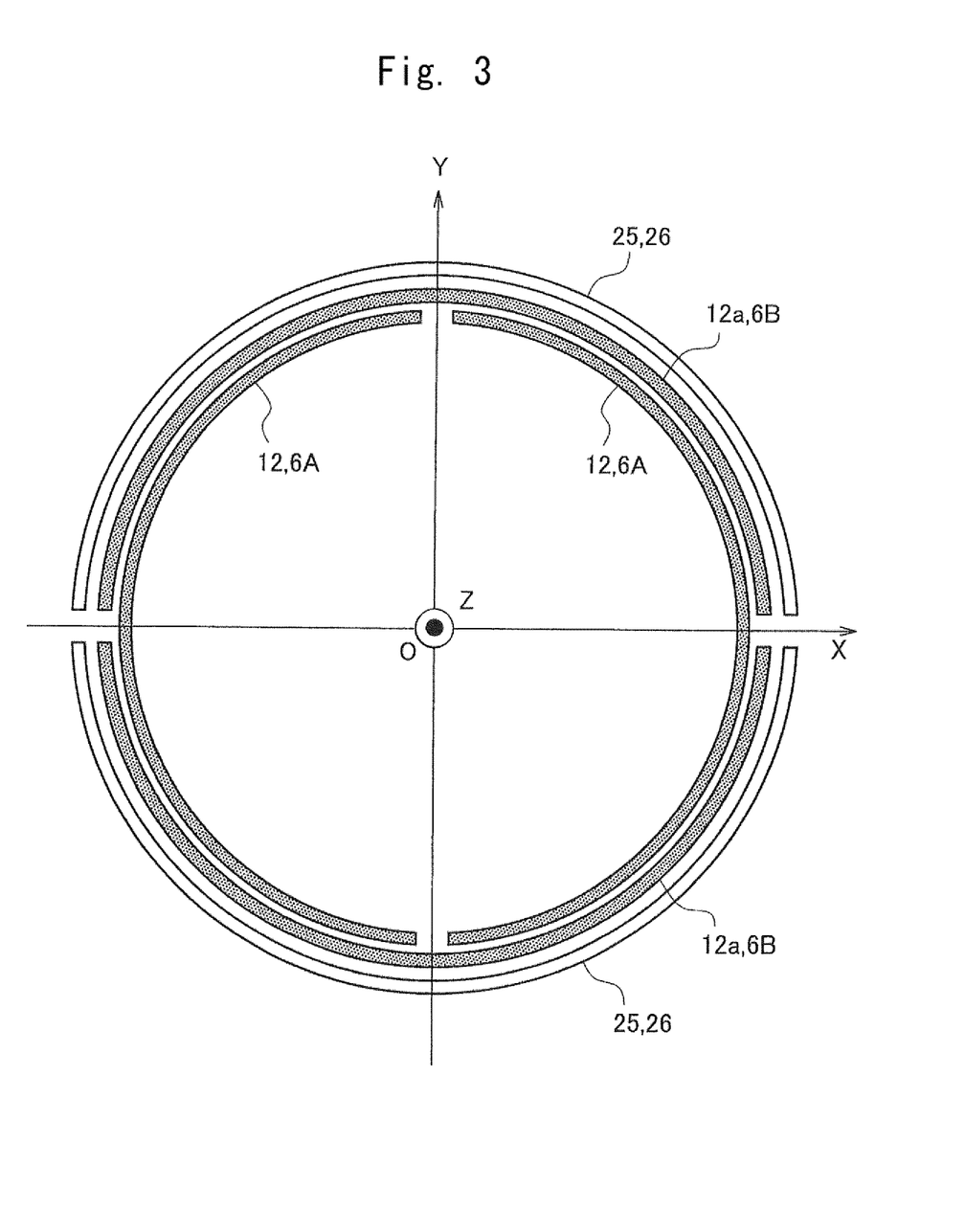
FIG. 3 is a schematic view illustrating a positional relationship between an X direction gradient magnetic field coil, a Y direction gradient magnetic field coil, and the additional coil in a gradient magnetic field coil of a magnetic resonance imaging apparatus according to the first embodiment of the present invention when viewed from a Z axis direction.

The main coils 12 and 12a have the same structure and are formed by machining a plate-shaped copperplate or the like into a spiral shape in a rectangular form as illustrated in FIG. 4A. As illustrated in FIG. 3, the main coil 12 and the main coil 12a are arranged to be shifted from each other by 180 degrees in the circumferential direction, and are configured to overlap with each other in the radial direction in a state of being arranged to be shifted from each other by 180 degrees.

Although not illustrated, the shield coils 13 and 13a have substantially the same structure as the main coils 12 and 12a, and are formed by machining a plate-shaped copper plate or the like into a spiral shape in a rectangular form. A pair of shield coils 13 are arranged on a radially outer side of the main coil 12, and have a substantially semicircular shape. A pair of shield coils 13a are arranged on a radially outer side of the main coil 12a, and have a substantially semicircular shape. The shield coils 13 and 13a are arranged to be shifted from each other by 180 degrees in the circumferential direction, and are configured to overlap (overlap) with each other in the radial direction in a state of being arranged to be shifted from each other by 180 degrees.

In the MRI apparatus according to the present embodiment, the main coils 12, 12a, and 10 generate the gradient magnetic field in the imaging region 2 and the shield coils 13, 13a, and 11 suppress unnecessary leakage of magnetic fields to the magnetic pole 1 and suppress the generation of eddy electric current in the metal portion of the magnetic pole 1. An active shield type gradient magnetic field coil 6 is adopted, so that high image quality may be achieved even during high speed pulse energization by suppressing the generation of eddy electric currents and reducing the influence of the eddy electric current magnetic field on the image quality.

As illustrated in FIG. 2B, the first additional coil 25 and the second additional coil 26 as additional coils are juxtaposed (fixed side by side) on the radially outer side of the gradient magnetic field coil 6 in the radially inner side of the magnetic pole 1.

As illustrated in FIG. 2A, the first additional coil 25 and the second additional coil 26 are formed in correspondence with the size of the main coil 12a of the X direction gradient magnetic field coil 6A or the main coil 12a of the Y direction gradient magnetic field coil 6B. In other words, the first additional coil 25 and the second additional coil 26 include an electric current circuit that is ½ turn around the Z axis 9 (semicircular shape when viewed from the Z axis 9 direction). The first additional coil 25 and the second additional coil 26 each have a loop shape, and are configured such that the electric current circulating directions 27 are different from each other.

In the present embodiment, as illustrated in FIG. 3, the first additional coil 25 and the second additional coil 26 are arranged symmetrically in the Y axis direction with the plane including the X axis and the Z axis 9 as a boundary, in correspondence with the main coil 12a of the Y direction gradient magnetic field coil 6B.

In the direction of the Z axis 9, the second additional coil 26 is disposed on the side close to the imaging region 2, and the first additional coil 25 is disposed on the side away from the imaging region 2.

Here, the gradient magnetic field distribution when the first additional coil 25 and the second additional coil 26 are not disposed will be described.

In an example in which the gradient magnetic field strength in the Y axis direction is set on the vertical axis (Y axis), the distribution of the gradient magnetic field 14 as illustrated in FIG. 4B is obtained. Since the gradient magnetic field adds the position information to the magnetic resonance signal, the larger magnetic field strength in the imaging area 2 results in a clearer signal for the position discrimination, and the distribution with a slope closer to a straight line (excellent linearity) allows more accurate position information to be obtained, thus reducing distortions of the image.

Figure 5:
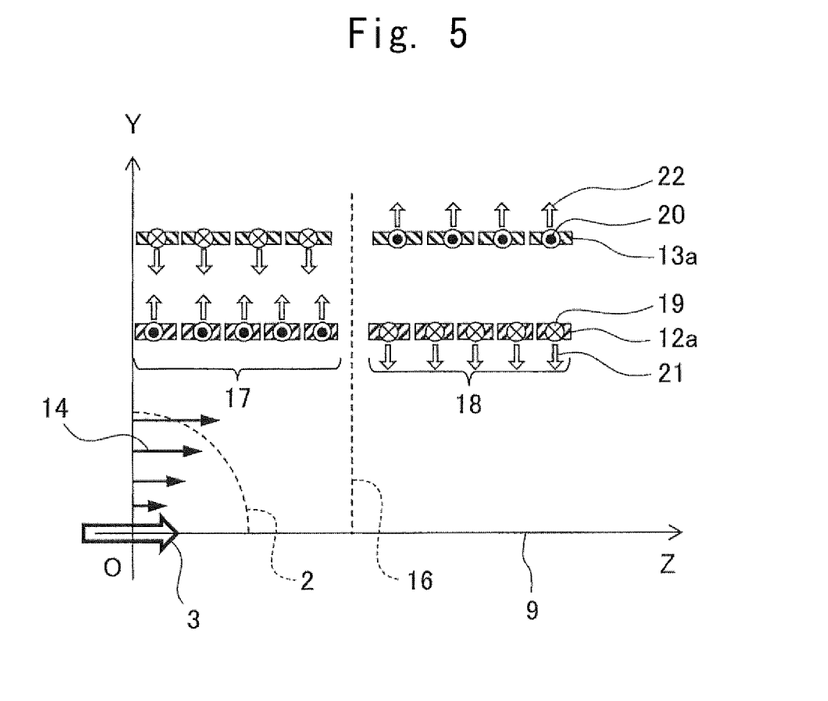
FIG. 5 is a schematic explanatory view illustrating a distribution of electromagnetic force generated in a conductor of a Y direction gradient magnetic field coil when no additional coil is disposed.

When the gradient magnetic field coil 6 is energized, as illustrated in FIG. 5, in the static magnetic field in which the Z direction components are uniform, the electromagnetic forces 21 and 22 are generated respectively in the main coil 12a and the shield coil 13a of the Y direction gradient magnetic field coil 6B with the static magnetic field caused by the magnetic pole 1 (see FIG. 1, hereinafter the same) according to the electric current direction. Since the electric current directions 19 and 20 of the main coil 12a and the shield coil 13a are in opposite directions to each other and are circling around the turn center 16, the region 17 close to the imaging region 2 and the region 18 away from the imaging region 2 are reversed with respect to the cross-sectional direction of the conductor. When the Z direction components of the static magnetic field are uniform, since the electromagnetic force generated in the main coil 12a and the shield coil 13a is equal between the side 17 close to the imaging area 2 and the side 18 away from the imaging area 2 with the center 16 of the turn as the boundary, the electromagnetic force resultant force generated in the entire gradient magnetic field coil 6B is approximately zero.

Figure 6:
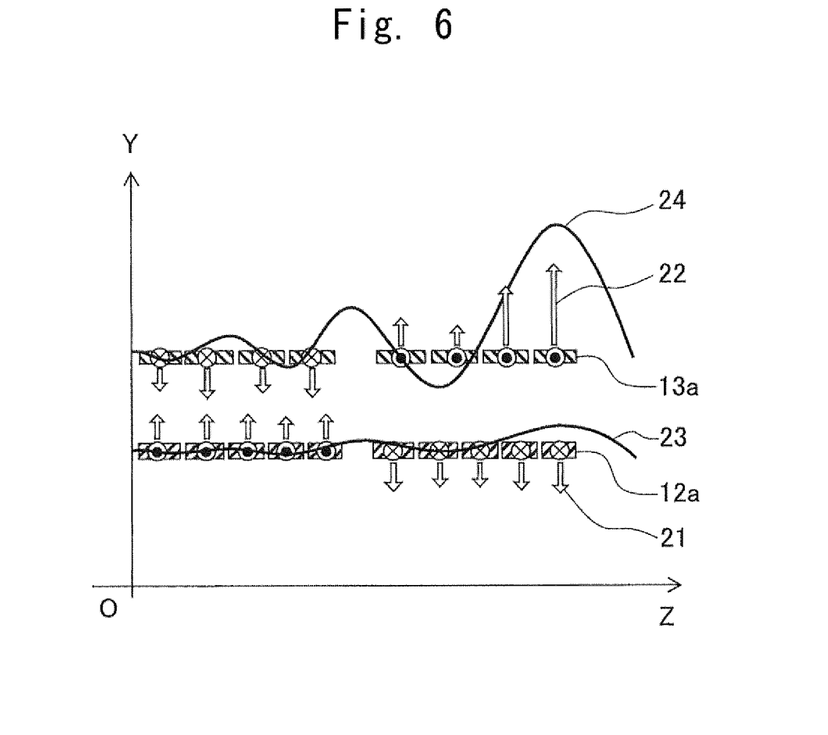
FIG. 6 is a schematic explanatory view illustrating a relationship between the electromagnetic force generated in a conductor of the Y direction gradient magnetic field coil and a static magnetic field distribution when no additional coil is disposed.

However, although the actual magnetic field distribution generated by the magnetic pole 1 is uniform in the imaging region 2, it becomes more non-uniform as being further away from the imaging region 2 in the radial direction and away from the imaging region 2 in the Z direction. The gradient magnetic field coil 6 is arranged on the radially outer side than the high frequency coil 7 in the radially inner side of the magnetic pole 1. Therefore, as illustrated in FIG. 6, the magnetic flux densities 23 and 24 on the main coil 12a and the shield coil 13a in the Z direction are greatly fluctuated on the shield coil 13a side as compared with the main coil 12a side, and the fluctuation is increasing on the side away from the imaging region 2 than on the side closer to the imaging region 2. Especially, in the radially outer side of the shield coil 13a, a larger fluctuation arises in the Z direction than in the static magnetic field at the imaging center. Therefore, a electromagnetic force resultant force 22 is generated in the Z direction in the gradient magnetic field direction (Y direction) by the static magnetic field and the electric current of the gradient magnetic field coil 6. Since the resultant force 22 in the gradient magnetic field direction causes the entire gradient magnetic field coil 6 to vibrate, it causes vibration of the MRI apparatus.

Figure 7:
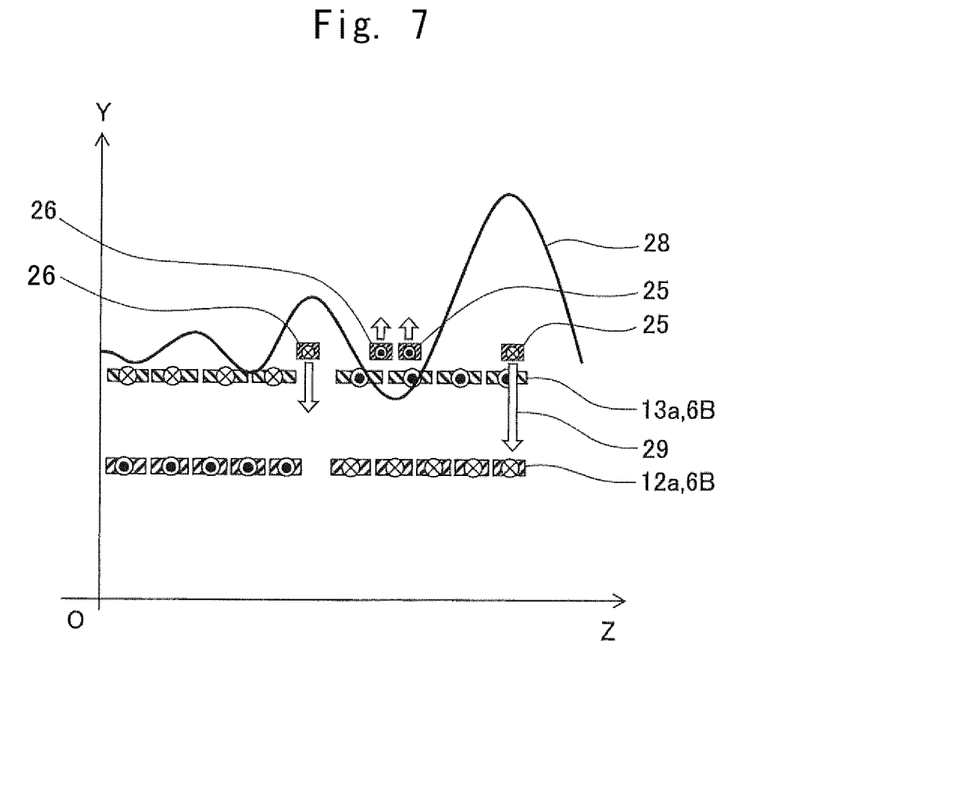
FIG. 7 is a schematic explanatory view illustrating a relationship between a direction of an electric current and an electromagnetic force of the additional coil and a static magnetic field distribution with respect to the Y direction gradient magnetic field coil of the magnetic resonance imaging apparatus according to the first embodiment of the present invention.

In the present embodiment, as illustrated in FIG. 7, the first additional coil 25 and the second additional coil 26 are arranged (fixed) on the gradient magnetic field coil 6 at positions where the Z direction components 28 of the static magnetic field have a larger nonuniform distribution than the distribution on the shield coil 13a. In this way, by arranging the conductors of the first additional coil 25 and the second additional coil 26 at positions where the Z direction component 28 of the static magnetic field is large and small, a large electromagnetic force resultant force 29 may be generated even with a small number of conductors.

For example, when a circulating circuit of 1 meter is formed in a static magnetic field strength of 1 Tesla and the electric current of 100 amperes flows in the circulating direction in the circuit, an electromagnetic force resultant force 29 of 100 N may be generated. Therefore, it is possible for the electromagnetic force resultant force (opposing force) 29 generated in the first additional coil 25 and the second additional coil 26 by the static magnetic field at the position of the first additional coil 25 and the second additional coil 26 and the electric current of the first additional coil 25 and the second additional coil 26, to counteract the electromagnetic force resultant force 22 generated in the gradient magnetic field coil 6.

In this way, by providing two additional coils including the first additional coil 25 and the second additional coil 26, it is possible to effectively use the nonuniformity of the static magnetic field distribution. Since the magnetic flux densities generated by the first additional coil 25 and the second additional coil 26 are opposite to each other, it is possible to prevent the disturbance of the magnetic field applied to the imaging region 2 by the first and second additional curves 25 and 26.

According to the present embodiment described above, it is possible to suitably reduce the vibration electromagnetic force of the gradient magnetic field coil 6 which causes the vibration of the subject 4. Therefore, it is possible to prevent the subject 4 from feeling uncomfortable at the time of being imaged, and also to reduce the influence of the image quality due to the vibration of the static magnetic field.

Second Embodiment

Figure 8:
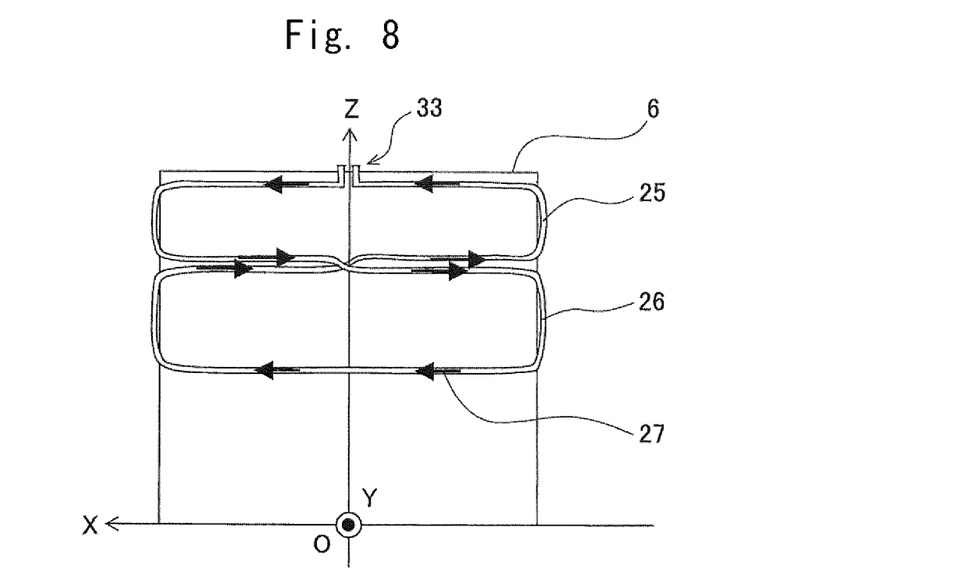
FIG. 8 is a top view illustrating a wiring structure of an additional coil with respect to the Y direction gradient magnetic field coil of a magnetic resonance imaging apparatus according to a second embodiment of the present invention.

Next, the MRI apparatus according to the second embodiment will be described with reference to FIG. 8. FIG. 8 is a top view illustrating a wiring structure of an additional coil with respect to the Y direction gradient magnetic field coil of a magnetic resonance imaging apparatus according to the second embodiment of the present invention.

In the present embodiment, the first additional coil 25 and the second additional coil 26 are formed of one electric current circuit. The first additional coil 25 and the second additional coil 26 share an electric current inflow/outflow path 33 connected to a power supply (not illustrated).

Each of the first additional coil 25 and the second additional coil 26 includes a conductor that intersects each other at an adjacent portion, and have a shape of approximately number '8'. As a result, the electric current circulating direction of the first additional coil 25 and the second additional coil 26 is reversed.

In the additional coil with respect to the X direction gradient magnetic field coil 6A, the structure is such that the X axis and the Y axis are interchanged (rotated by −90 degrees around the Z axis), in FIG. 8.

According to the present embodiment, the same operation and effect as in the first embodiment can be achieved. It is possible to supply the first additional coil 25 and the second additional coil 26 from the same power supply, thereby simplifying the wiring.

Third Embodiment

Figure 9:
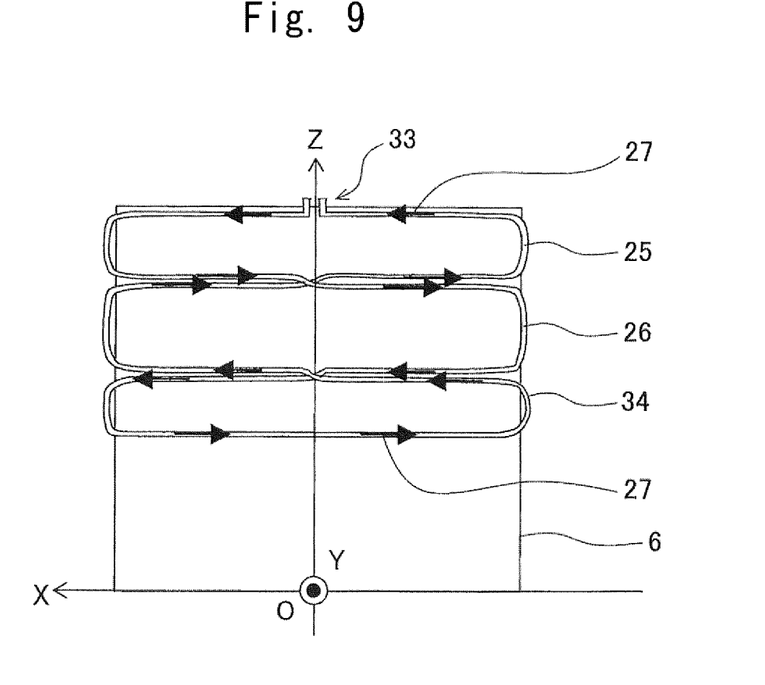
FIG. 9 is a top view illustrating a wiring structure of an additional coil with respect to the Y direction gradient magnetic field coil of a magnetic resonance imaging apparatus according to a third embodiment of the present invention.

Next, the MRI apparatus according to the third embodiment will be described with reference to FIG. 9. FIG. 9 is a top view illustrating a wiring structure of an additional coil with respect to the Y direction gradient magnetic field coil of a magnetic resonance imaging apparatus according to the third embodiment of the present invention.

In the present embodiment, a third additional coil 34 is provided in addition to the first additional coil 25 and the second additional coil 26. The first additional coil 25, the second additional coil 26, and the third additional coil 34 are formed of one electric current circuit. The first additional coil 25, the second additional coil 26, and the third additional coil 34 share the electric current inflow/outflow path 33 connected to a power supply (not illustrated).

The first additional coil 25, the second additional coil 26, and the third additional coil 34 include conductors that intersect each other at an adjacent portion. As a result, the electric current circulating direction of the first additional coil 25, the second additional coil 26, and the third additional coil 34 is reversed.

In the additional coil with respect to the X direction gradient magnetic field coil 6A, the structure is such that the X axis and the Y axis are interchanged (rotated by −90 degrees around the Z axis), in FIG. 9.

According to the present embodiment, the same operation and effect as in the first embodiment can be achieved. Since it is possible to generate electromagnetic force for adjustment in a wider range, it is possible to reduce the value of electric current flowing through the first additional coil 25, the second additional coil 26, and the third additional coil 34. It is possible to supply the first additional coil 25, the second additional coil 26, and the third additional coil 34 from the same power supply, thereby simplifying the wiring.

The first additional coil 25, the second additional coil 26, and the third additional coil 34 have one circuit configuration for supplying power from the same power supply, but it is not limited to this, and may be configured as independent circuits of each other having independent power supplies.

Fourth Embodiment

Figure 10:
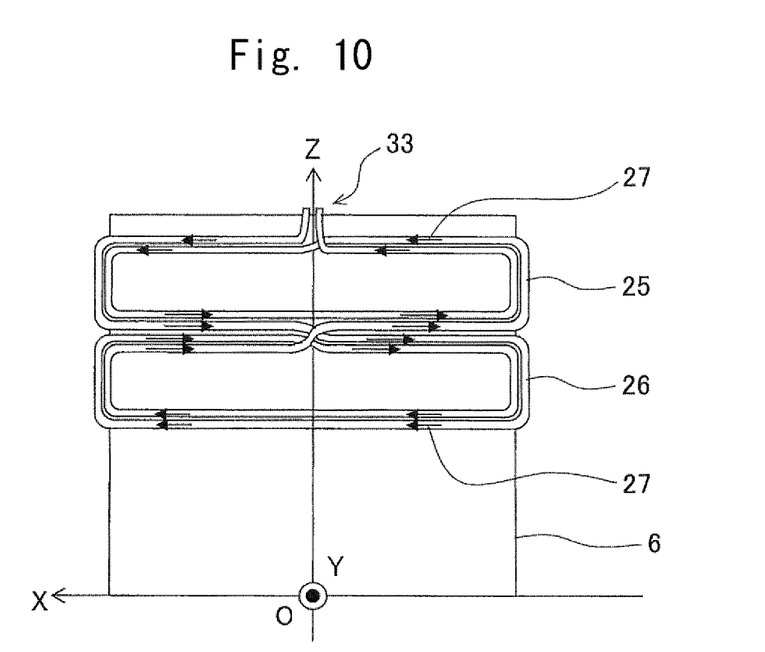
FIG. 10 is a top view illustrating a wiring structure of an additional coil with respect to the Y direction gradient magnetic field coil of a magnetic resonance imaging apparatus according to a fourth embodiment of the present invention.

Next, the MRI apparatus according to the fourth embodiment will be described with reference to FIG. 10. FIG. 10 is a top view illustrating a wiring structure of an additional coil with respect to the Y direction gradient magnetic field coil of a magnetic resonance imaging apparatus according to the fourth embodiment of the present invention.

In the present embodiment, both the first additional coil 25 and the second additional coil 26 are configured by two turns.

In the additional coil with respect to the X direction gradient magnetic field coil 6A, the structure is such that the X axis and the Y axis are interchanged (rotated by −90 degrees around the Z axis), in FIG. 10.

According to the present embodiment, the same operation and effect as in the first embodiment can be achieved. By increasing the number of turns, it is possible to reduce the value of electric current flowing through the first additional coil 25 and the second additional coil 26.

It is possible to simplify the driving power supply for the first additional coil 25 and the second additional coil 26.

The first additional coil 25 and the second additional coil 26 may have different numbers of turns from each other with the same electric current circuit. As a result, the first additional coil 25 and the second additional coil 26 may be configured by the same driving power source, and the electromagnetic force resultant force of the gradient magnetic field coil 6 may be more effectively reduced according to the static magnetic field distribution.

Both of the first additional coil 25 and the second additional coil 26 are illustrated to be formed by two turns, but it is not limited to this, and both may be formed by three or more turns.

Alternatively, one of the first additional coil 25 and the second additional coil 26 may be formed by two or more turns, or the first additional coil 25 and the second additional coil 26 may be formed by different numbers of turns from each other.

Fifth Embodiment

Figure 11:
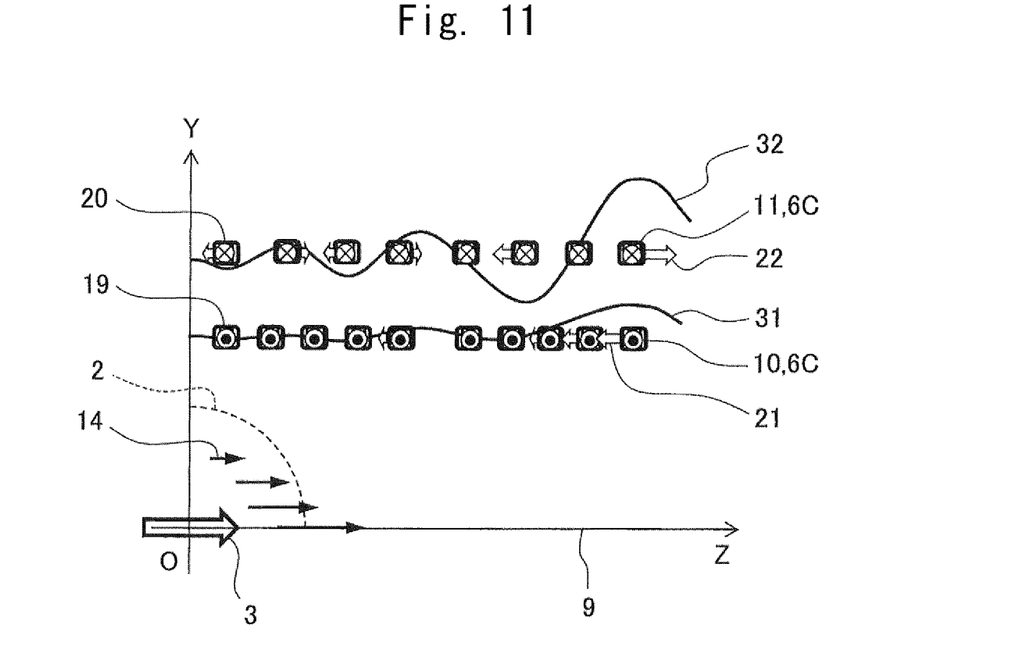
FIG. 11 is a schematic explanatory view illustrating a relationship between an electromagnetic force generated in a conductor of a Z direction gradient magnetic field coil and a static magnetic field distribution when no additional coil is disposed, which is provided for explaining a magnetic resonance imaging apparatus according to a fifth embodiment of the present invention.
Figure 12:
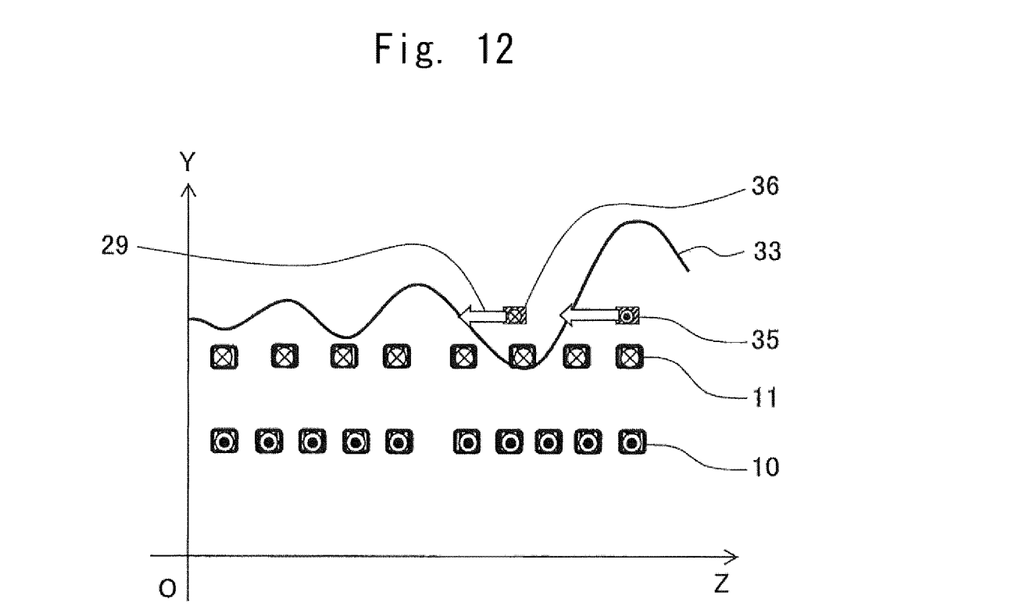
FIG. 12 is a schematic explanatory view illustrating a relationship between a direction of an electric current and an electromagnetic force of the additional coil and a static magnetic field distribution with respect to the Z direction gradient magnetic field coil of the magnetic resonance imaging apparatus according to the fifth embodiment of the present invention.

Next, the MRI apparatus according to the fifth embodiment will be described with reference to FIGS. 11 and 12. FIG. 11 is a schematic explanatory view illustrating a relationship between an electromagnetic force generated in a conductor of the Z direction gradient magnetic field coil and a static magnetic field distribution when no additional coil is disposed for explaining a magnetic resonance imaging apparatus according to the fifth embodiment of the present invention. FIG. 12 is a schematic explanatory view illustrating a relationship between a direction of an electric current and an electromagnetic force of the additional coil and a static magnetic field distribution with respect to the Z direction gradient magnetic field coil of the magnetic resonance imaging apparatus according to the fifth embodiment of the present invention.

In the present embodiment, the first additional coil 35 and the second additional coil 36 are arranged with respect to the Z direction gradient magnetic field coil 6C.

As illustrated in FIG. 11, the Z direction gradient magnetic field 14 generated in the imaging area 2 has a distribution in which the Z direction component of the static magnetic field is strong in proportion to the coordinate of the Z axis 9. As described above, the main coil 10 and the shield coil 11 of the Z direction gradient magnetic field coil 6C have a substantially solenoid shape, and the direction of the flowing electric current is the circulating direction around the Z axis. The main coil 10 and the shielding coil 11 are energized in the direction opposite to each other with respect to the peripheral direction.

In the configuration without an additional coil, electromagnetic force resultant forces 21 and 22 in the Z direction due to nonuniform static magnetic field distribution are generated in the Z direction gradient magnetic field coil 6C. The components of the static magnetic field in this case are represented by radial components 31 and 32.

In the portion where the Z direction components of the static magnetic field are uniform, since the radial direction component is substantially zero, the radial direction component also changes greatly in the positive and negative directions as being further away from the imaging region 2, and being further toward the radially outer side. Therefore, the direction of the Z direction electromagnetic force generated in the gradient magnetic field coil 6C is also reversed depending on the positive and negative of the radial direction component of the static magnetic field.

Therefore, in the present embodiment, as illustrated in FIG. 12, the first additional coil 35 and the second additional coil 36 are arranged so that the electric current direction is determined according to the positive or negative of the static magnetic field distribution 37 in the radial direction. Thereby, it is possible to generate the electromagnetic force resultant force 29 in the same direction. The circulating direction of the first additional coil 35 and the second additional coil 36 is the entire circumference around the Z axis 9.

In the present embodiment, the vibration electromagnetic force of the gradient magnetic field coil 6, which causes vibration of the subject 4, may be suitably reduced. Therefore, it is possible to prevent the subject 4 from feeling uncomfortable at the time of being imaged, and also to reduce the influence of the image quality due to the vibration of the static magnetic field.

The first additional coil 35 and the second additional coil 36 may be configured as one electric current circuit, and each of the first additional coil 35 and the second additional coil 36 may be formed by a plurality of turns. The case of installing the third additional coil may be used together.

Sixth Embodiment

Figure 13:
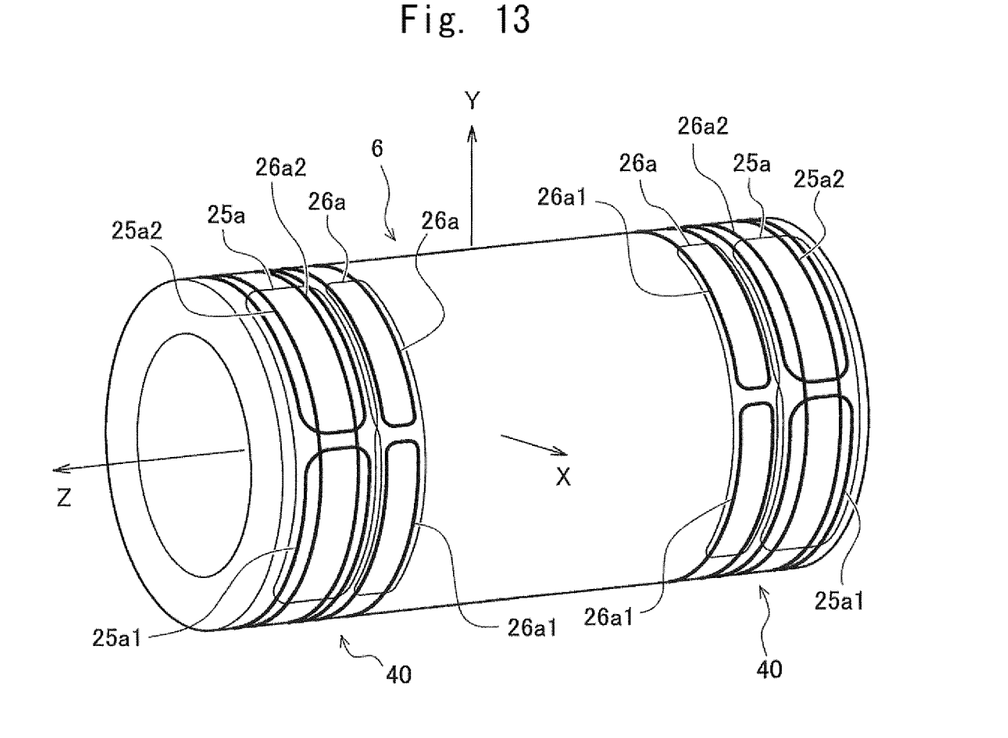
FIG. 13 is a perspective view illustrating an installation mode of an additional coil of a magnetic resonance imaging apparatus according to a sixth embodiment of the present invention.
Figure 14:
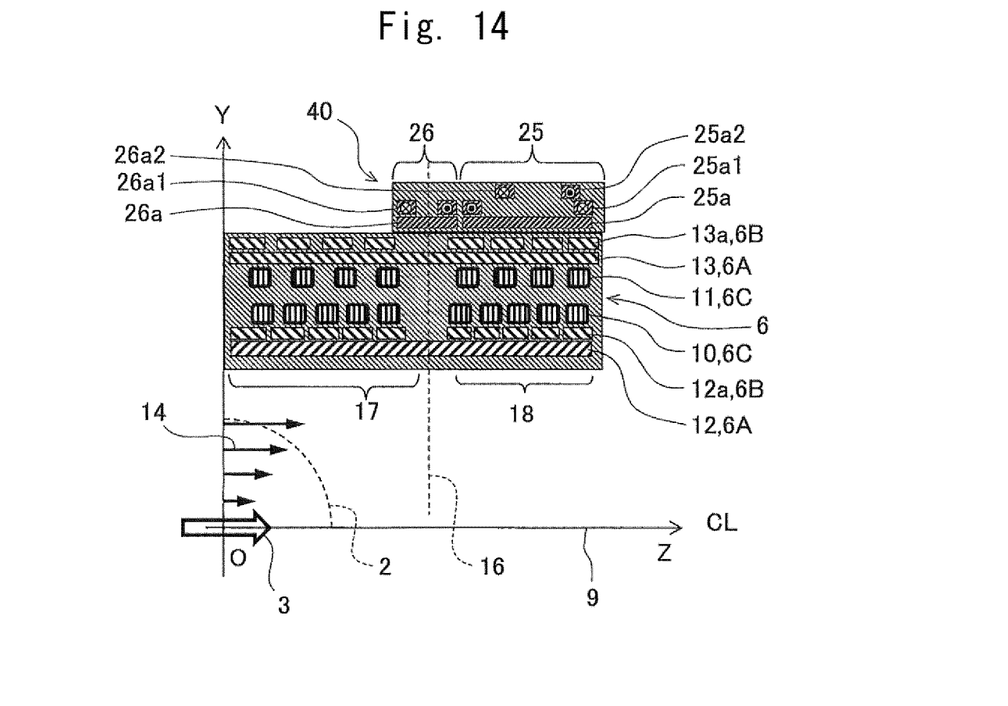
FIG. 14 is a partial cross-sectional view illustrating a conductor structure of a gradient magnetic field coil of a magnetic resonance imaging apparatus according to the sixth embodiment of the present invention.

Next, the MRI apparatus according to the sixth embodiment will be described with reference to FIGS. 13 and 14. FIG. 13 is a perspective view illustrating an installation mode of an additional coil of a magnetic resonance imaging apparatus according to the sixth embodiment of the present invention, and FIG. 14 is a partial cross-sectional view illustrating a conductor structure of a gradient magnetic field coil of a magnetic resonance imaging apparatus according to the sixth embodiment of the present invention.

In the present embodiment, the additional coil device 40 is disposed (fixed) on the radially outer side of the gradient magnetic field coil 6 in a layered shape.

The additional coil device 40 includes first additional coils 25a, 25a1, and 25a2, and second additional coils 26a, 26a1, and 26a2.

The first additional coil 25a and the second additional coil 26a correspond to the main coil 12 of the X direction gradient magnetic field coil 6A. The first additional coil 25a and the second additional coil 26a have a substantially semicircular shape when viewed from the Z axis 9 direction and are symmetrically arranged in the X axis direction with the plane including the Y axis and the Z axis as a boundary.

The first additional coil 25a1 and the second additional coil 26a1 correspond to the main coil 12a of the Y direction gradient magnetic field coil 6B. The first additional coil 25a1 and the second additional coil 26a1 have the substantially semicircular shape when viewed from the Z axis 9 direction and are symmetrically arranged in the Y axis direction with the plane including the X axis and the Z axis as a boundary.

The first additional coil 25a2 and the second additional coil 26a2 correspond to the main coil 10 of the Z direction gradient magnetic field coil 6C. The first additional coil 25a2 and the second additional coil 26a2 are arranged around the Z axis 9 in the circumferential direction.

Each of the additional coils in the additional coil device 40 is integrally fixed with resin or the like to be insulated from each other.

According to the present embodiment, the electromagnetic force generated in the additional coil device 40 and the electromagnetic force of the gradient magnetic field coil 6 counteract each other, so that it is possible to effectively reduce the vibration of the gradient magnetic field coil 6.

By separating the layer of the gradient magnetic field coil 6 from the layer of the additional coil device 40 in the radial direction, even when the static magnetic field distribution is different, the electromagnetic force resultant force of the gradient magnetic field coil 6 may be easily reduced by adjusting the arrangement of the additional coil device 40.

Although the embodiments of the present invention have been described above, the present invention is not limited to the embodiments described above, and can be appropriately modified without departing from the gist thereof.

For example, although the first additional coil 25, the second additional coil 26 (the third additional coil 34) and the additional coil device 40 are installed (fixed on) radially outer side of the gradient magnetic field coil 6 in each of the embodiments described above as an example, but the present invention is not limited to this, and they may be installed integrally with the gradient magnetic field coil 6.

In the first to fourth embodiments, the first additional coil 25 and the second additional coil 26 are arranged in correspondence with the Y direction gradient magnetic field coil 6B, but the present invention is not limited to this, and may be arranged in correspondence with the X direction gradient magnetic field coil 6A. The first additional coil 25 and the second additional coil 26 may be arranged in correspondence with both of the Y direction gradient magnetic field coil 6B and the X direction gradient magnetic field coil 6A.

What is claimed is:

1. A magnetic resonance imaging apparatus, comprising:
a cylindrical magnetic pole for generating a static magnetic field in an imaging region;
a cylindrical gradient magnetic field coil arranged on a radially inner side of the magnetic pole coaxially with the magnetic pole to generate a dynamic magnetic field having a linear magnetic field strength in the imaging region;
a cylindrical high frequency coil arranged on a radially inner side of the gradient magnetic field coil coaxially with the magnetic pole and the gradient magnetic field coil to generate a high frequency magnetic field in the imaging region;
a computer system for processing signals to obtain images; and
at least two loop-shaped additional coils having different electric current circulating directions and arranged on a radially outer side of the gradient magnetic field coil, wherein
the at least two loop-shaped additional coils share an electric current flow path connected to a power supply, wherein
a first loop-shaped additional coil of the at least two loop-shaped additional coils includes a first conductor and a second loop-shaped additional coil of the at least two loop-shaped additional coils includes a second conductor, and wherein
the first conductor and the second conductor intersect each other in an axial direction.

2. The magnetic resonance imaging apparatus according to claim 1, wherein
when an axis of the magnetic pole is a Z axis, a direction of the static magnetic field generated by the magnetic pole is a Z direction along the Z axis, a direction perpendicular to the Z direction is a Y direction, and a direction perpendicular to the Z direction and the Y direction is an X direction,
the gradient magnetic field coil includes an X direction gradient magnetic field coil, a Y direction gradient magnetic field coil, and a Z direction gradient magnetic field coil for generating a gradient magnetic field,
the X direction gradient magnetic field coil is wound in a spiral shape around an axis extending in the X direction, the Y direction gradient magnetic field coil is wound in a spiral shape around an axis extending in the Y direction, the Z direction gradient magnetic field coil is wound annularly around the Z axis, and the at least two additional coils are disposed on a side close to the imaging region and a side away from the imaging region.

3. The magnetic resonance imaging apparatus according to claim 1, wherein the additional coils are juxtaposed on a side close to the imaging region and a side away from the imaging region along an axial direction of the Z axis.

4. The magnetic resonance imaging apparatus according to claim 1, wherein conductors forming the additional coils are disposed to generate an opposing force of an electromagnetic force generated in the gradient magnetic field coil with respect to the magnetic pole.

5. The magnetic resonance imaging apparatus according to claim 1, wherein when a direction along the axis of the magnetic pole as a Z axis is defined as a Z direction, a direction perpendicular to the Z direction is defined as a Y direction, and a direction perpendicular to the Z direction and the Y direction is defined as an X direction, the gradient magnetic field coil includes an X direction gradient magnetic field coil, a Y direction gradient magnetic field coil, and a Z direction gradient magnetic field coil for generating a gradient magnetic field, and conductors forming the additional coils are disposed to generate an opposing force of an electromagnetic force generated in the X direction gradient magnetic field coil or the Y direction gradient magnetic field coil by a magnetic field component in the Z direction of a magnetic field of the magnetic pole.

6. The magnetic resonance imaging apparatus according to claim 1, wherein when a direction along an axis of the magnetic pole as a Z axis is defined as a Z direction, a direction perpendicular to the Z direction is defined as a Y direction, and a direction perpendicular to the Z direction and the Y direction is defined as an X direction, the gradient magnetic field coil includes an X direction gradient magnetic field coil, a Y direction gradient magnetic field coil, and a Z direction gradient magnetic field coil for generating a gradient magnetic field, and conductors forming the additional coils are disposed to generate an opposing force of an electromagnetic force generated in the Z direction gradient magnetic field coil by a radial magnetic field component having the Z axis of a magnetic field of the magnetic pole as a central axis.

7. The magnetic resonance imaging apparatus according to claim 1, wherein the additional coils are stacked in a layered shape on a radially outer side of the gradient magnetic field coil with an axis of the magnetic pole as a center.

8. The magnetic resonance imaging apparatus according to claim 1, further comprising: a third loop-shaped additional coil that shares the electric current flow path with the at least two loop-shaped additional coils and includes a third conductor that intersects with at least one of the at least two loop-shaped additional coils in the axial direction.

* * * * *